United States Patent [19]
Ohtake et al.

[11] Patent Number: 6,088,290
[45] Date of Patent: Jul. 11, 2000

[54] SEMICONDUCTOR MEMORY DEVICE HAVING A POWER-DOWN MODE

[75] Inventors: Hiroyuki Ohtake, Tokyo; Shigeo Ohshima, Yokohama, both of Japan; Takehiro Hasegawa, Burlington, Vt.

[73] Assignee: Kabushiki Kaisha Toshiba, Kawasaki, Japan

[21] Appl. No.: 09/132,644

[22] Filed: Aug. 11, 1998

[30] Foreign Application Priority Data

Aug. 13, 1997 [JP] Japan ..................................... 9-218605

[51] Int. Cl.⁷ ..................................................... G11C 8/00
[52] U.S. Cl. ...................... 365/233; 365/189.05; 365/227
[58] Field of Search .............................. 365/189.05, 233, 365/194, 189.01, 227

[56] References Cited

U.S. PATENT DOCUMENTS

| | | | |
|---|---|---|---|
| 5,337,285 | 8/1994 | Ware et al. ............................ | 365/227 |
| 5,623,453 | 4/1997 | Shinozaki ............................... | 365/233 |
| 5,719,812 | 2/1998 | Seki et al. ............................. | 365/194 |

Primary Examiner—Son Mai
Attorney, Agent, or Firm—Loeb & Loeb, LLP

[57] ABSTRACT

When a clock enable signal asynchronous with a clock signal is set at a high level, a power-down control circuit sets a power-down signal at a high level to release a power-down mode. When the power-down mode is released, a clock control circuit outputs an internal clock signal such that an output signal of a command decoder can be latched. According to such a constitution, a period of time from the latching of the command after releasing the power-down mode to the time when the command can be transferred will be reduced, and a high-speed operation can be attained.

9 Claims, 8 Drawing Sheets

SEMICONDUCTOR MEMORY DEVICE HAVING A POWER-DOWN MODE

BACKGROUND OF THE INVENTION

The present invention relates to a semiconductor memory device such as a synchronous DRAM (Dynamic Random Access Memory), which works in synchronization with a clock signal.

Recently, a synchronous DRAM has been studied and developed as a DRAM capable of attaining high-speed data access and a large data band width (i.e., large data byte in unit of a period of time) as high as an SRAM (Static Random Access Memory). The 4M-bit and 16M-bit generation synchronous DRAMs have been already put into a market. The most remarkable feature of the synchronous DRAM is to attain data reading operation higher than that of the conventional DRAM. The synchronous DRAM can reduce a so-called column access time (t CAC): a period of time from the latching of data by a bit line controlled by a column circuit of a memory cell array to the output of the latched data to I/O pins, in comparing with the conventional device. All the operations of the synchronous DRAM are synchronism with the rising of clock signals supplied to clock signal input pins. The operations of the synchronous DRAM are quite different from that of the conventional one.

The synchronous DRAM has a power-down mode. The power-down mode is provided to reduce the power consumption of the device at a stand-by state at which a chip is not accessed. In the power-down mode, the device is controlled to stop the operations of input buffer circuits and the like in the chip in order to reduce the power consumption.

FIG. 9 shows the conventional power-down controlling section used in a synchronous DRAM and the surrounding circuit. Input buffer circuits 81 and 82 are respectively supplied with a clock signal CLK. The input buffer circuits 81 and 82 respectively output clock signals CLKIN1 and CLKIN2 to clock driving circuits 83 and 84. The clock driving circuits 83 and 84 output internal clock signals CP1 and CP2. The internal clock signals CP1 and CP2 are supplied to stages constituting a pipe-line structure.

A clock enable signal CKE for allowing the clock signal to input is supplied to an input buffer circuit 85. The input buffer circuit 85 outputs an output signal CKEIN to be supplied to a clock control circuit 86. A signal BURST is also supplied to the clock signal control circuit 86, which is a signal representing that the device is in a burst operation in which data is serially output in synchronization with the clock signal CLKIN2 output from the input buffer circuit 82 and the clock signal CLK. In response to the signal BURST, the clock control circuit 86 generates a power-down signal /PDENTR which represents that the device enters in a power-down mode. The clock control circuit 86 further generates a mask signal /CLKMSK for masking the clock signal when the power-down signal /PDENTR is generated. The mask signal /CLKMSK is supplied to the clock driving circuits 83 and 84, while, the power-down signal /PDENTR is supplied to the input buffer circuit 81 and a plurality of input buffer circuit 87 provided to the device in addition to the input buffer circuit 81.

The plurality of input buffer circuits 87 are supplied with signals such as a row address strobe signal /RAS, a column address strobe signal /CAS, a chip select signal /CS, and a write enable signal /WE. "CTRLSIG" denotes all the signals input into the input buffer circuits 87. An output signal COMIN of each of the input buffer circuits 87 is supplied to a command decoder 88. Similarly to the signal CTRLSIG, "COMIN" also denotes all the signals output from the input buffer circuits 87 (i.e., the raw address strobe signal /RAS, the column address strobe signal /CAS, the chip select signal /CS, the write enable signal /WE and the like). A command decoder 88 decodes the row address strobe signal /RAS, the column address strobe signal /CAS, and the like, and generate a command COMDEC to instruct various types of operation such as write operation, read operation, or the like which corresponds to the decoded signal. The generated command COMDEC is supplied to a clocked inverter circuit 91 driven by the internal clock signals CP1 and /CP1, through a clocked inverter circuit 89 also driven by the internal clock signal CP1 and /CP1 and an inverter circuit 90. An output signal COMLTC of the clocked inverter circuit 91 is supplied to an internal circuit (not shown).

FIG. 10 shows the constitution of the input buffer circuit 81. The input buffer circuit 81 includes a current mirror circuit CM1 constituted of P-channel MOS transistors (hereinafter referred to as "PMOS transistors") 81a, 81b, and 81c, N-channel MOS transistors (hereinafter referred to as "NMOS transistors") 81d, 81e, and 81f. A gate of the PMOS transistor 81a is applied with a ground potential Vss, and a gate of the NMOS transistor 81d is applied with a reference potential Vref. Similarly, a gate of the NMOS transistor 81e is supplied with a clock signal CLK, and a gate of the NMOS transistor 81f is supplied with the power-down signal /PDENTR.

Between a connection node N1 connecting the PMOS transistor 81c with the NMOS transistor 81e and the power supply Vcc, a PMOS transistor 81g is arranged to connect them. A gate of the PMOS transistor 81g is supplied with the power-down signal /PDENTR.

The connection node N1 is further connected to one input terminal of a NAND circuit 81i constituting a flip-flop circuit 81h. Between one input terminal and the other terminal of a NAND circuit 81j constituting the flip-flop circuit 81h together with the NAND circuit 81i, a plurality (three, for example) of inverter circuits constituting a delay circuit 81k are connected in series. An output terminal of the NAND circuit 81i is connected to inverter circuits 81l and 81m in series, and a signal CLKIN1 is output from an output terminal of the inverter circuit 81m.

FIG. 11 shows the constitution of the clock driving circuit 83. The clock driving circuit 83 is constituted from a NAND circuit 83a supplied with the signal CLKIN1 and the mask signal /CLKMSK and an inverter circuit 83b connected to an output terminal of the NAND circuit 83a. The internal clock signal CP1 is output from an output terminal of the inverter circuit 83b.

FIG. 12 shows the constitution of the input buffer circuit 82, and FIG. 13 shows the clock driving circuit 84. The input buffer circuit 82 has substantially the same constitution as that of the input buffer circuit 81. The clock driving circuit 84 also has substantially the same constitution as that of the clock driving circuit 83. Accordingly, like reference numerals are used to designate like portions respectively having the same function as those in FIGS. 10 and 12 for simplicity of illustration, and only different portions will be described below.

Unlike in the input buffer circuit 81, the gate of the NMOS transistor 81f is applied with the power supply voltage Vcc, and the PMOS transistor 81g shown in FIG. 10 is not used in the input buffer circuit 82 shown in FIG. 12. The inverter circuit 81m outputs a signal CLKIN2.

In the clock driving circuit 84 shown in FIG. 13, one of input terminals of the NAND circuit 83a is supplied with the signal CLKIN2, and the inverter circuit 83b outputs an internal clock signal CP2.

FIG. 14 shows the circuit constitution of the input buffer circuit 87. The input buffer 87 includes a current mirror circuit CM2 constituted from PMOS transistors 87a, 87b, and 87c, and NMOS transistors 87d, 87e, and 87f. A gate of the PMOS transistor 87a is applied with the ground potential Vss, and a gate of the NMOS transistor 87d is applied with the reference potential Vref. Similarly, a gate of the NMOS transistor 87e is supplied with the signal CTRLSIG, and a gate of the NMOS transistor 87f is supplied with the power-down signal /PDENTR.

Between a connection node N2 connecting the PMOS transistor 87c with the NMOS transistor 87e and a power supply Vcc, a PMOS transistor 87g is arranged to be connected thereto. A gate of the PMOS transistor 87g is supplied with the power-down signal /PDENTR.

Three inverter circuits 87h, 87i, and 87j are connected in series to a connection node N2, and a signal COMIN is output from the output terminal of an inverter circuit 87j.

FIG. 15 shows the constitution of the input buffer circuit 85. The input buffer circuit has substantially the same constitution as that of the input buffer circuit 87. Accordingly, the same elements are denoted by the same reference numerals, and only the different elements will be described below.

Unlike in the input buffer circuit 87, the gate of the NMOS transistor 87f shown in FIG. 15 is applied with the power supply voltage Vcc, and the PMOS transistor 87g is not used to be connected with the connection node N2. Further, the inverter circuit 87j outputs a signal CKEIN.

FIG. 16 shows the constitution of the clock control circuit 86. In this circuit, clocked inverter circuits 86a, 86c, and 86g, and inverter circuits 86b, 86d, 86f, 86h, and 86i are connected in series as shown in the drawing. The inverter circuit 86i outputs the mask signal /CLKMSK from the output terminal. The inverter circuit 86d is connected to the clocked inverter circuit 86e in parallel to constitute a latch circuit. The clocked inverter circuits 86a, 86c, 86e, and 86g are respectively driven by the signal CLKIN2 or the inverted signal /CLKIN2 obtained by inverting the signal CLKIN2. An output terminal of the clocked inverter circuit 86g is connected to one of input terminals of a NOR circuit 86i. The other input terminal of the NOR circuit 86i is supplied with the signal BURST, and an output terminal of the NOR circuit 86i is connected to an input terminal of the inverter circuit 86k. From an output terminal of the inverter circuit 86k, the power-down signal /PDENTR is output.

FIG. 17 shows the operations of the circuits shown in FIGS. 9, 10, 11, 12, 13, 14, 15, and 16. With the circuit constitutions as described above, when a clock enable signal CKE supplied to the input buffer circuit 85 is set at a low level, the signal CKEIN as the output of the input buffer circuit 85 is also set at a low level. A power-down signal /PDENTR is thus output from the clock control circuit 86 to set the device in the power-down mode. The operations of the input buffer circuits 81 and 87 are stopped upon receiving the power-down signal /PDENTR to reduce the power consumption. In this time, the mask signal /CLKMSK is output from the clock control circuit 86 to mask the internal clock signals CP1 and CP2 output from the clock driving circuits 83 and 84.

Contrarily, when the clock enable signal CKE to be input into the input buffer circuit 85 is set at a high level in the power-down mode, the input buffer circuit 85 constantly set at a active state outputs the signal CKEIN. The input buffer circuit 82 is also constantly set at an active state. The clock control circuit 86 thus takes the signal CKEIN output from the input buffer circuit 85 upon receiving the signal CLKIN2 supplied from the input buffer circuit 82 and the inverted signal /CLKIN2. In accordance with the taken signal CKEIN, the clock control circuit 86 sets the power-down signal /PDENTR and the mask signal /CLKMSK at a high level. The power-down mode is released thereby, and the input buffer circuits 81 and 87 and the like are set at an active state to execute operation such as decoding and latching of a command.

As described above, with the above-mentioned conventional constitution, the power-down mode is released upon receiving the clock signal CLK externally supplied when the clock enable signal CKE is set at a high level. In other words, in order to release the power-down mode to activate the circuits, the conventional constitution necessarily needs one external clock signal CLK after the clock enable signal CKE is set at a high level. More specifically, as shown in FIG. 17, the internal clock signal CP1 is never output unless a clock signal CLKn+1 next to the clock signal CLKn for releasing the power-down mode is output. In accordance with the internal clock signal CP1, the clocked circuit 91 receives a command. Accordingly, a period of time necessarily intervenes between the releasing of the power-down mode and the latching of the command.

Further, the period of time for releasing the power-down mode depends on a cycle time. Accordingly, if the cycle time is elongated, the period of time from the setting of the clock enable signal CKE at a high level to the releasing of the power-down mode is elongated naturally. Therefore, with a long cycle time, a period of time from the releasing of the power-down mode to the latching of the command is further elongated, in comparing with the normal case.

In addition, with the above-mentioned constitution, the signal CLKIN2 generated from the clock signal CLK is necessary to output in order to release the power-down mode, and thus the input buffer circuit 82 for generating the signal CLKIN2 needs to be constantly activated. Accordingly, the input buffer circuit for receiving a clock signal must comprise two circuits: an input buffer circuit set at a non-activate state in the power-down mode; and an input buffer circuit set at an activate state in the power-down mode. The input buffer circuit for receiving the clock signal is thus inevitably complicated in structure. Further, the device is provided with a plurality of input buffer circuits activated in the power-down mode, and thus the power consumption will inevitably increase.

BRIEF SUMMARY OF THE INVENTION

The present invention has been developed in order to solve the above-mentioned problem, and intends to provide a semiconductor memory device capable of reducing the period of time from the releasing of the power-down mode to the input of a command and capable of forming a circuit constitution simple to reduce the power consumption.

The above-mentioned object of the present invention can be attained by the semiconductor memory device comprising: a power-down control circuit for generating first and second power-down signals in accordance with first and second logic levels of a clock enable signal, the power-down control circuit generating the first power-down signal for setting the device in a power-down mode in accordance with the first logic level of the clock enable signal which allows a clock signal to input into the device, and generating the second power-down signal for releasing the power-down mode in accordance with the second logic level of the clock enable signal; a clock controlling section connected to the power-down control circuit, the clock controlling section making an internal clock signal non-activate in accordance with the first power-down signal output from the power-down control circuit, and activating the internal clock signal in accordance with the second power-down signal; a decoder for decoding the input signal; and a latch circuit connected to the decoder, the latch circuit latching an output signal of the decoder in accordance with the internal clock signal activated by the clock controlling section.

As described above, the power-down control circuit according to the present invention sets the power-down signal at a high level in order to release the power-down mode when the clock enable signal asynchronous with the clock signal is set at a high level. When the power-down mode is released, a clock controlling section activates the internal clock signal. Upon receiving the internal clock signal, the latch circuit latches an output signal of the command decoder. With this constitution, a period of time from the releasing of the power-down mode to the latching of a command at which the command can be transferred will be reduced, resulting that a high-speed operation can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

An embodiment of the present invention will be described below with reference to the drawings.

Figure 2:
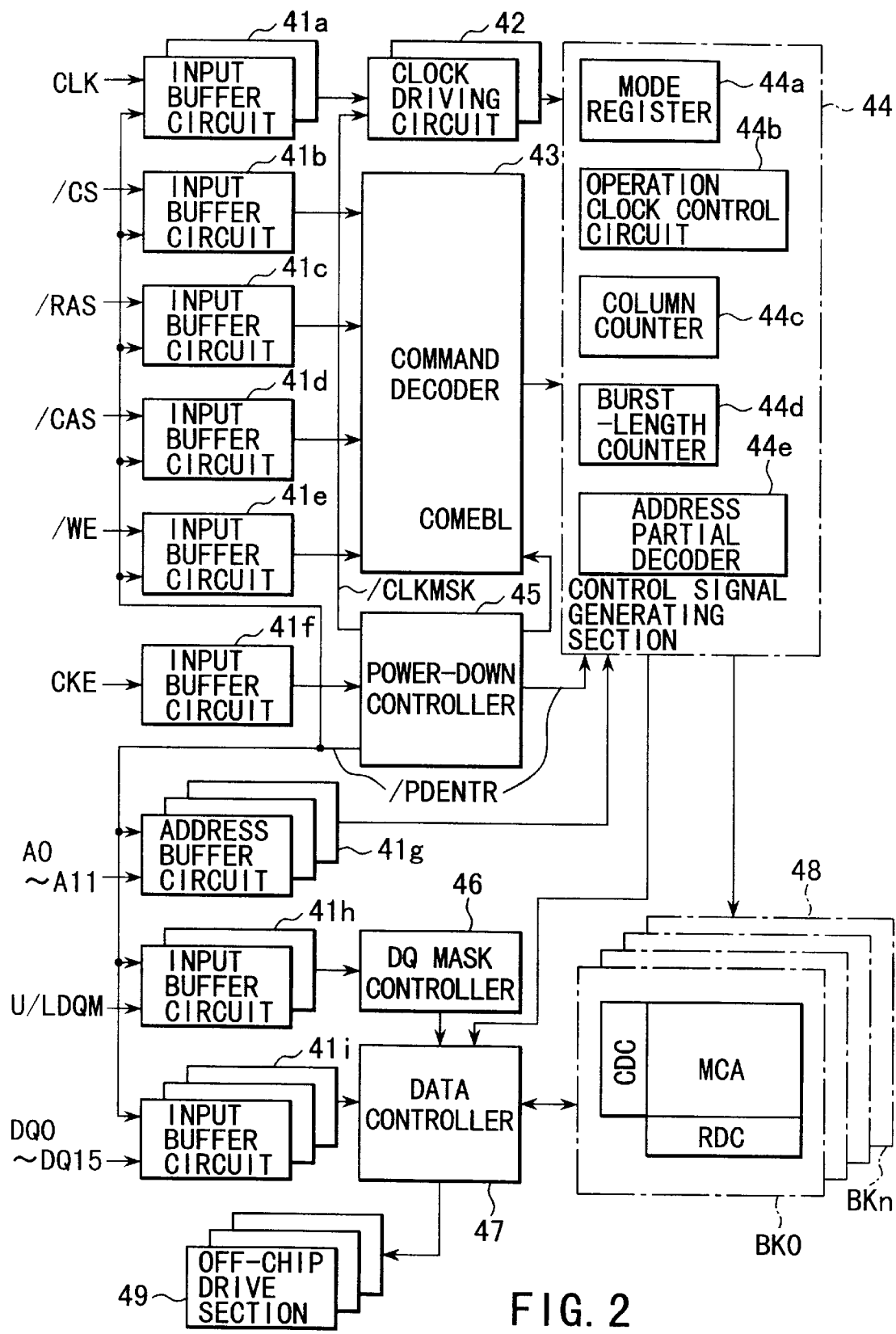
FIG. 2 is a block diagram of an example of a semiconductor memory device applied with the present invention.

A constitution of a semiconductor memory device applied with the present invention will be described at first with reference to FIG. 2. In FIG. 2, a clock signal CLK, a chip select signal /CS, a row address strobe signal /RAS, a column address strobe signal /CAS, and a write enable signal /WE are respectively supplied from external connection pins (not shown). The clock signal CLK is supplied to a plurality of input buffer circuits 41a, and the chip select signal /CS is supplied to an input buffer circuit 41b. The row address strobe signal /RAS is supplied to an input buffer circuit 41c, and the column address strobe signal /CAS is supplied to an input buffer circuit 41d. Similarly, the write enable signal /WE is supplied to an input buffer circuit 41e.

The clock signals input into each of the input buffer circuit 41a are respectively supplied to a plurality of clock driving circuits 42. The clock driving circuits 42 supply the clock signals to a control signal generating section 44 or the other circuits. In order to decrease the skew of the clock signals supplied to the inside of the chip and to drive a plenty of circuits, the semiconductor device of the present invention is provided with a plurality of the clock driving circuits 42 and a plurality of the input buffer circuits 41a.

The chip select signal /CS, the row address strobe signal /RAS, the column address strobe signal /CAS, and the write enable signal /WE, which are output from the input buffer circuit 41b, 41c, 41d, 41e, are supplied to a command decoder 43. The command decoder 43 generates commands such as a data read command, a data write command, and a command for switching latency, in accordance a signal such as the row address strobe signal /RAS and the column address strobe signal /CAS. The output signal of the command decoder 43 is supplied to the control signal generating section 44 through a latch circuit (described later).

On the other hand, a clock enable signal CKE is supplied to a power-down controlling section 45 through an input buffer circuit 41f. The power-down controlling section 45 generates a power-down signal /PDENTR, a mask signal /CLKMSK, and a command enable signal COMEBL in response to the clock enable signal CKE. The power-down signal /PDENTR is supplied to the input buffer circuits 41a–41e, the control signal generating section 44, a plurality of address buffer circuits 41g, and input buffer circuits 41h and 41i, to reduce the power consumption of these circuits at the stand-by state. The mask signal /CLKMSK for suspending the clock signal is supplied to the clock driving circuit 42. The command enable signal COMEBL is supplied to the command decoder 43.

The control signal generating section 44 is supplied with address signals A0–A11 through the plurality of address buffer circuits 41g. The control signal generating section 44 includes a mode register 44a, an operation clock control circuit 44b, a column counter 44c, a burst-length counter 44d, an address partial decoder 44e, and a refresh circuit (not shown).

The mode register 44a stores control information of the latency and the burst-length. The operation clock signal circuit 44b controls an operation timing of the column decoder; a selection timing of a column selection line; an operation timing of a DQ buffer (not shown) for holding read data and write data; a clock signal for switching stages of the pipe-line structure; and the like, in accordance with a clock signal supplied from the clock driving circuit 42. The column counter 44c counts a column address in burst reading. The burst-length counter 44d counts the burst-length in the burst reading. The address partial decoder 44e partially decodes the column address and the row address. The decoded output of the address partial decoder 44e is supplied to a memory block 48. The memory block 48 has a plurality of banks BK0–BKn. The banks each includes a memory cell array MCA having a plurality of memory cells (not shown) arranged in matrix; a column decoder CDC for selecting corresponding one of the memory cells in accordance with the address signal; and a row decoder RDC.

A signal U/LDQM for masking the input/output of data is supplied to a DQ mask controller 46 through a plurality of input buffer circuits 41h, and input data DQ0–DQ15 input into external connection pins (not shown) is supplied to the data controller 47 through a plurality of input buffer circuits 41i. In writing data, the data controller 47 supplies the input data DQ0–DQ15 supplied from the input buffer circuit 41i to the memory cell block 48 in accordance with the output of the DQ mask controller 46. In reading data, the data controller 47 amplifies data read from the memory cell block 48 and supplies the amplified data to a plurality of off-chip driving sections 49. The off-chip driving sections 49 output the data to the external connection pints (not shown).

Figure 1:
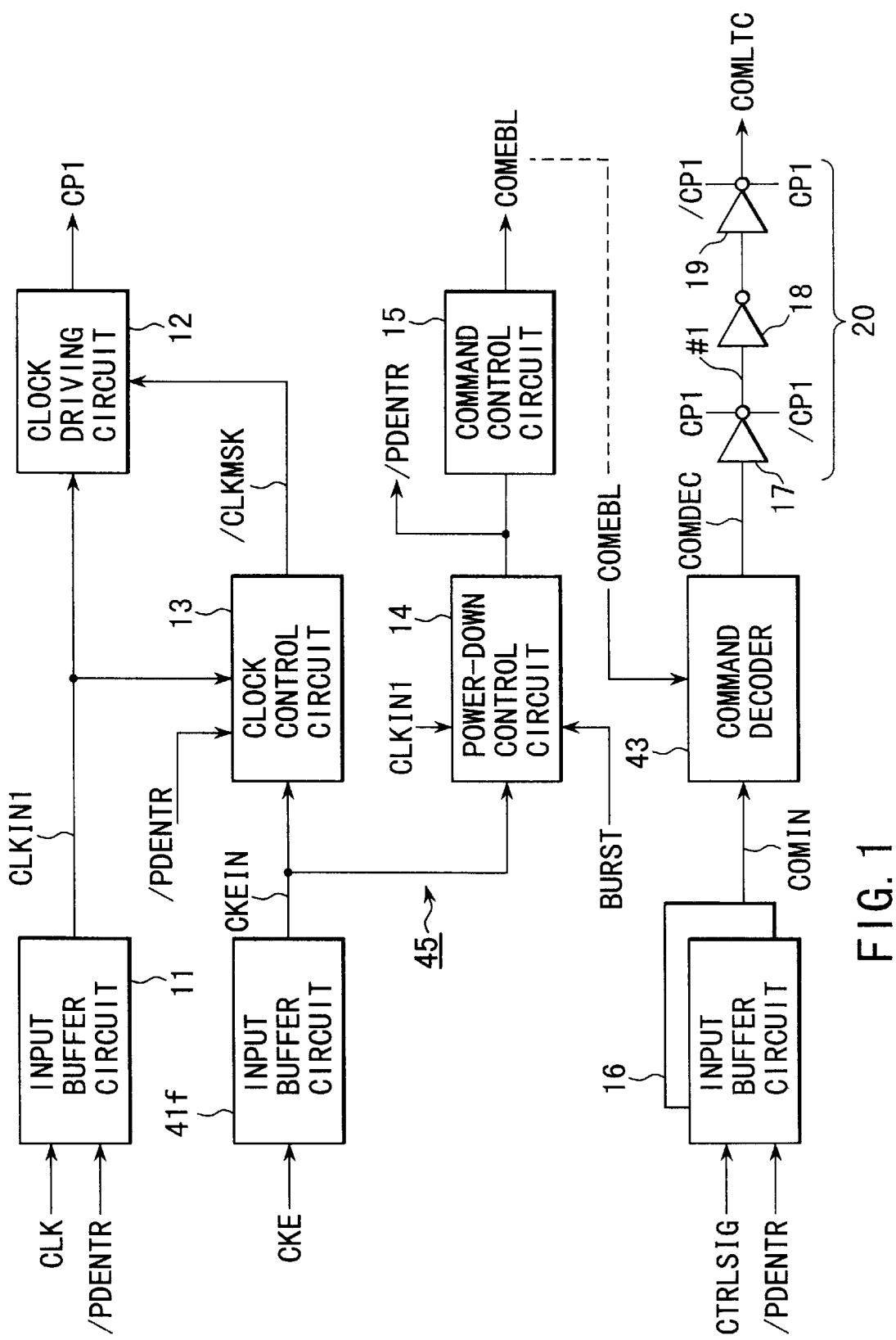
FIG. 1 is a block diagram of a circuit constitution showing an embodiment of the present invention.

FIG. 1 shows the embodiment of the present invention, in which a main part of the device shown in FIG. 2. The same elements are denoted by the same reference numerals throughout FIGS. 1 and 2.

Figure 10:
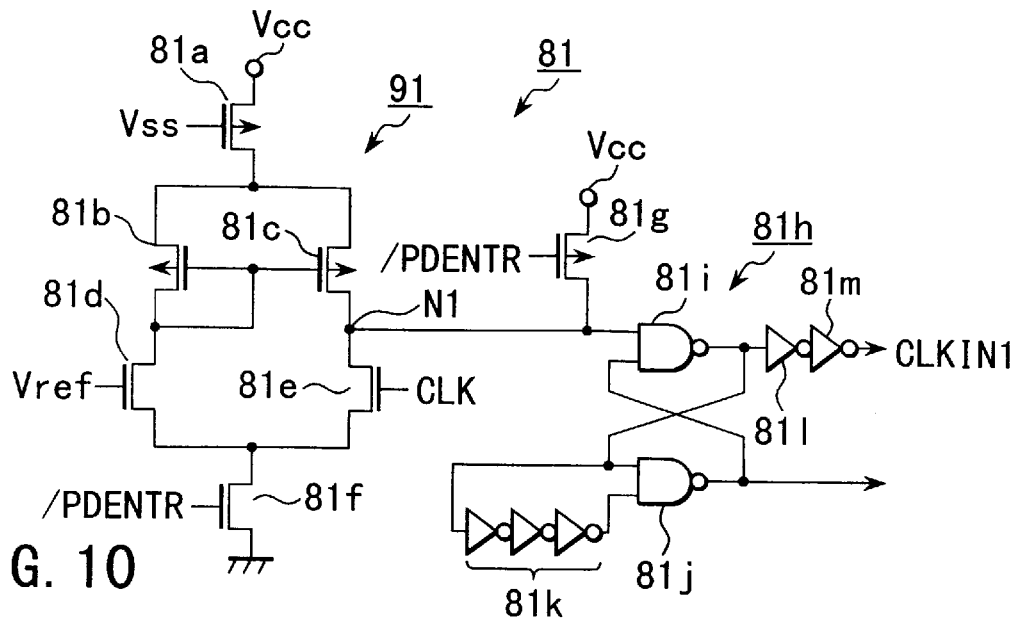
FIG. 10 is a circuit diagram showing one example of an input buffer circuit shown in FIG. 9.
Figure 11:
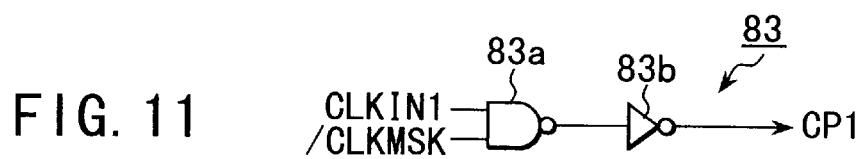
FIG. 11 is a circuit diagram showing one example of a clock driving circuit shown in FIG. 9.
Figure 12:
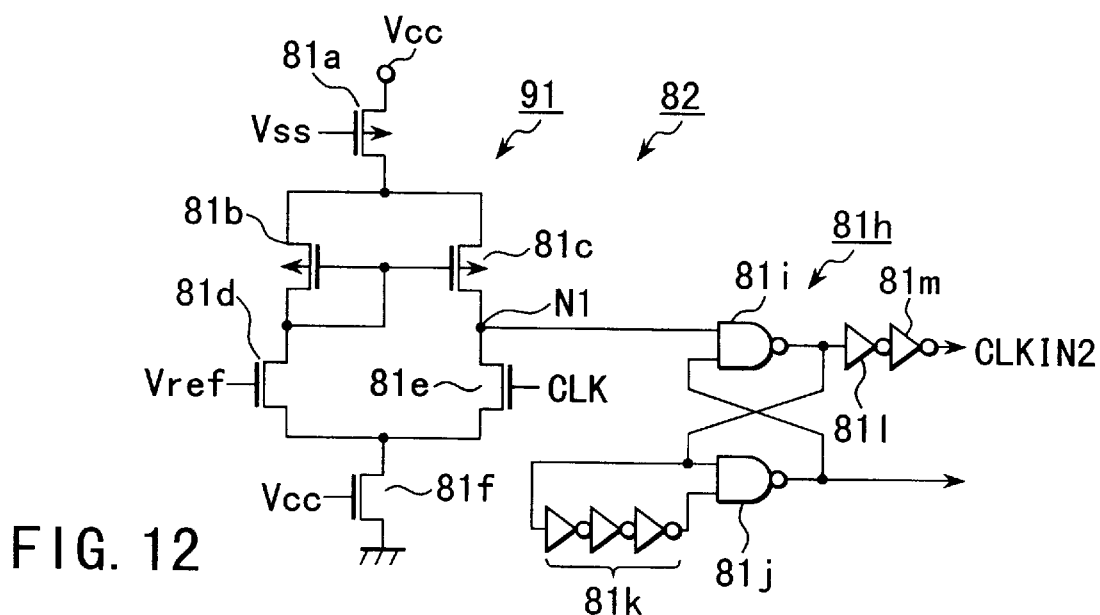
FIG. 12 is a circuit diagram showing one example of an input buffer circuit shown in FIG. 9.
Figure 13:
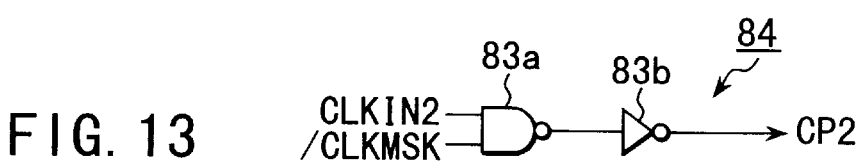
FIG. 13 is a circuit diagram showing one example of a clock driving circuit shown in FIG. 9.
Figure 14:
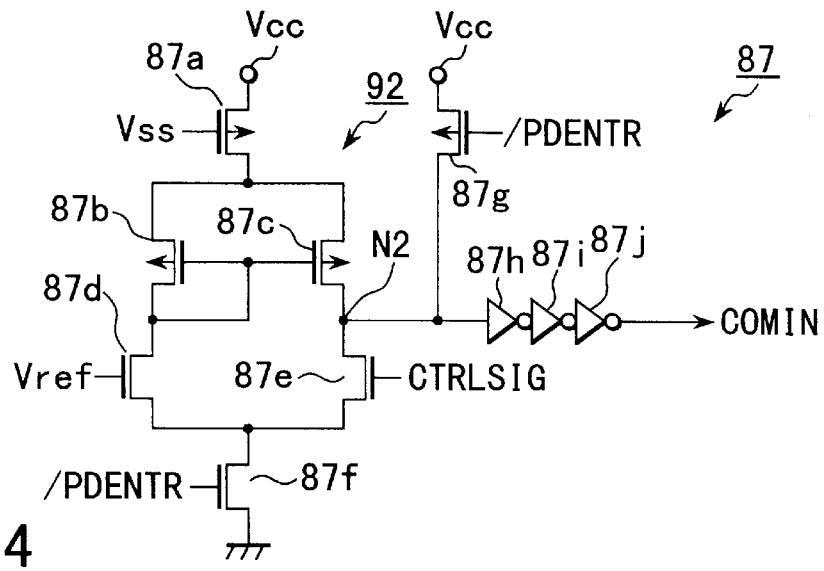
FIG. 14 is a circuit diagram showing one example of an input buffer circuit shown in FIG. 9.
Figure 15:
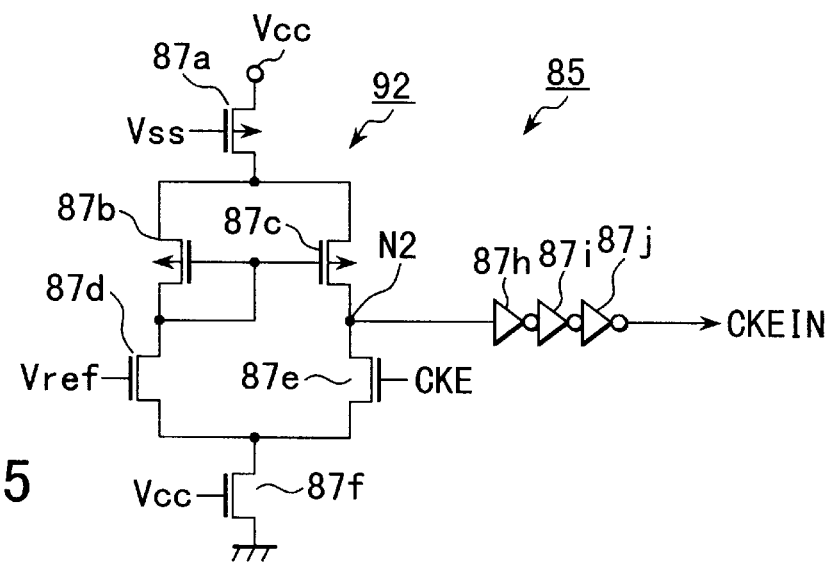
FIG. 15 is a circuit diagram showing one example of an input buffer circuit shown in FIG. 9.
Figure 16:
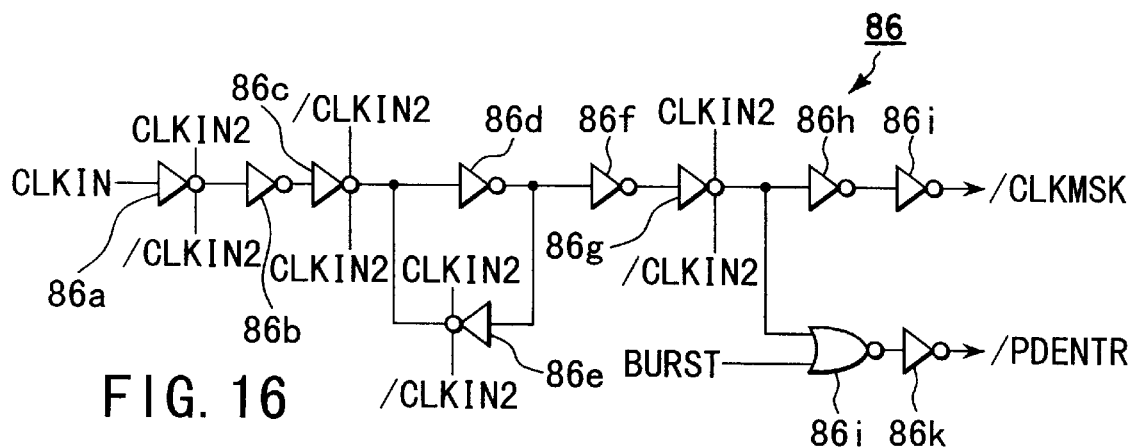
FIG. 16 is a circuit diagram showing one example of a clock control circuit shown in FIG. 9.
Figure 17:
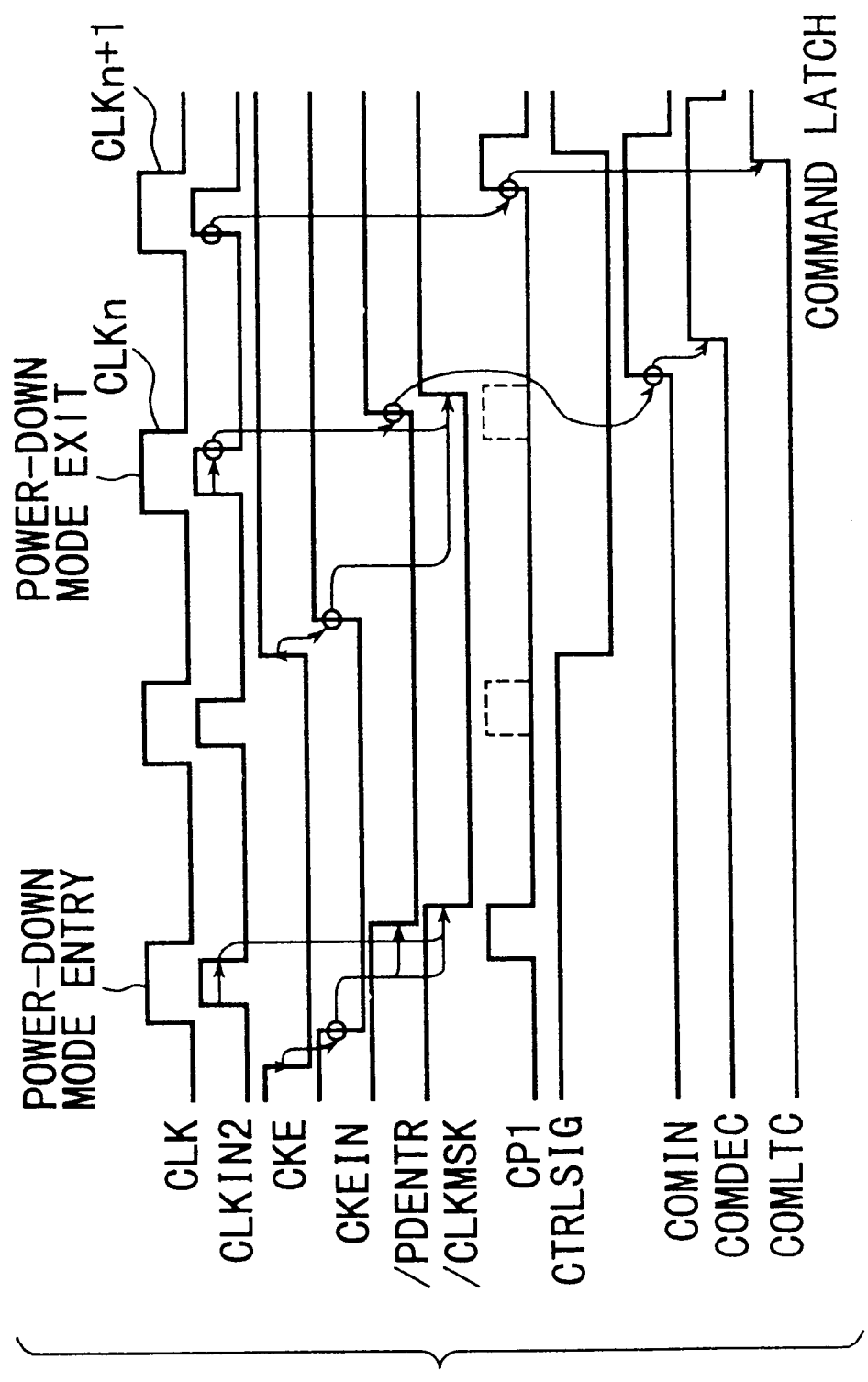
FIG. 17 is a timing chart showing the operations of the circuits shown in FIG. 9.

The input buffer circuit 11 is arbitrary one of the plurality of input buffer circuits 41a. The input buffer circuit 11 has the same constitution of that of the input buffer circuit 81 of the conventional device shown in FIG. 10, and is supplied with the clock signal CLK and the power-down signal /PDENTR. The signal CLKIN1 output from the input buffer circuit 11 is supplied to a clock driving circuit 12. The clock driving circuit 12 is arbitrary one of the clock driving circuits 42. The clock driving circuit 12 outputs an internal clock signal CP1 in response to the signal CLKIN1. The clock driving circuit 12 has the same constitution as that of the circuit shown in FIG. 11.

A power-down controller 45 comprises a clock control circuit 13, a power-down control circuit 14, and a command control circuit 15.

The power-down control circuit 14 is supplied with a signal CKEIN output from the input buffer circuit 41f; a signal CLKIN1 output from the input buffer circuit 11; and a signal BURST indicating burst operation. Upon receiving these signals, the power-down control circuit 14 generates a power-down signal /PDENTR. The power-down signal /PDENTR is supplied to each sections as described before, and the clock control circuit 13, and the command control circuit 15.

The clock control circuit 13 is supplied with the signal CKEIN output from the input buffer circuit 41f, the signal CLKIN1 output from the input buffer circuit 11, and the power-down signal /PDENTR. The clock control circuit 13 generates a mask signal /CLKMSK for masking the clock signal from these signals. The mask signal /CLKMSK is supplied to the clock driving circuit 12. The mask signal /CLKMSK masks a clock signal output from an activated input buffer circuit when the clock enable signal CKE is set at a low level in the burst operation, to set the device at a clock-suspend state at which no external clock signal can enter therein.

The command control circuit 15 as a delay circuit generates a command enable signal COMEBL when the power-down mode is released, and supplies the signal COMEBL to the command decoder 43. The command enable signal COMEBL, when the power-down mode is released, inhibits the decoding of the command till the internal clock signal CP1 output from the clock driving circuit 12 is set at a high level.

An input buffer circuit 16 indicates all the input buffer circuits 41b–41e shown in FIG. 2 as one circuit. Similarly, "CTRLSIG" shown in FIG. 1 denotes the signals shown in FIG. 2: the chip select signal /CS; the row address strobe signal /RAS; the column address strobe signal /CAS; and the write enable signal /WE.

An output terminal of the command decoder 43 is connected to a latch circuit 20. In the latch circuit 20, clocked inverter circuits 17 and 19 driven by an internal clock signals CP1 and /CP1 and an inverter circuit 18 are connected in series, as shown in the drawing. The latch circuit 20 operates in response to the internal clock signals CP1 and /CP1, and a command COMLTC is output from an output terminal of the clocked inverter circuit 19.

Figure 3:
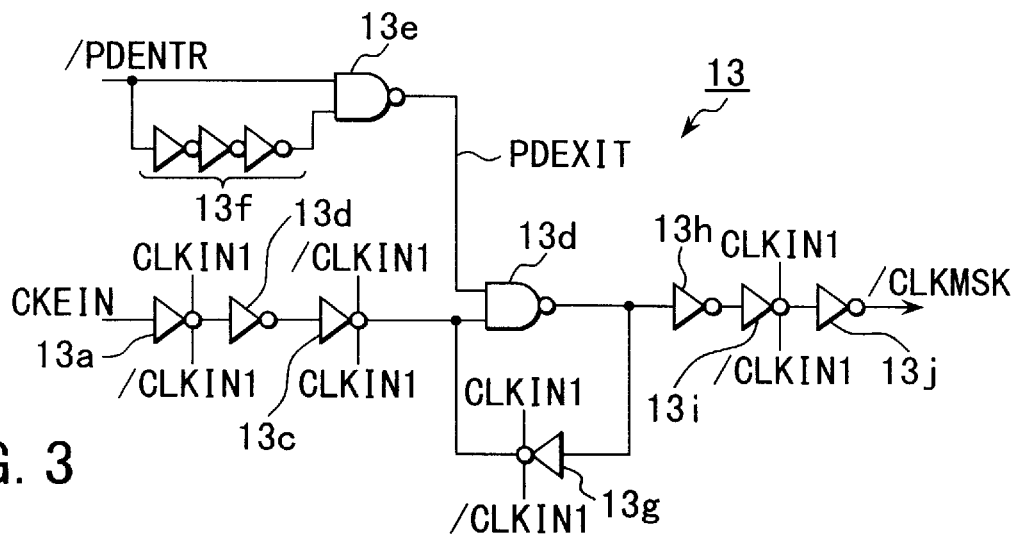
FIG. 3 is a circuit diagram showing one example of a clock control circuit shown in FIG. 1.

FIG. 3 shows the constitution of the clock control circuit 13. A signal CKEIN output from the input buffer circuit 41f is input into an input terminal of a clocked inverter circuit 13a driven by the internal clock signals CLKIN1 and /CLKIN1. An output of the clocked inverter circuit 13a is supplied to one of input terminals of a NAND circuit 13d through an inverter circuit 13b and a clocked inverter circuit 13c.

The power-down signal /PDENTR is input into one of input terminals of the NAND circuit 13e and one of the other input terminals of a NAND circuit 13e through a delay circuit 13f comprising three inverter circuits connected in series. An output terminal of the NAND circuit 13e is connected to one of the other input terminals of the NAND circuit 13d. A clocked inverter circuit 13g driven by the internal clock signals CLKIN1 and /CLKIN1 is connected between the output terminal of the NAND circuit 13d and the one of the input terminals of the NAND circuit 13d. Further, the output terminal of the NAND circuit 13d is connected in series to an inverter circuit 13h, a clocked inverter circuit 13i driven by the internal clock signals CLKIN1 and /CLKIN1, and an inverter circuit 13j. From an output terminal of the inverter circuit 13j, a mask signal /CLKMSK is output.

Figure 4:
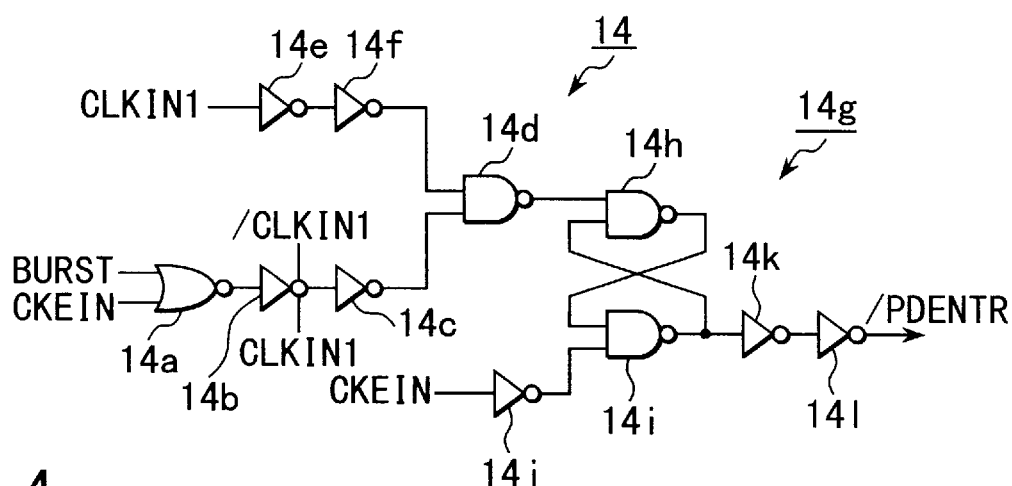
FIG. 4 is a circuit diagram showing one example of a power-down control circuit shown in FIG. 1.

FIG. 4 shows the constitution of the power-down control circuit 14. A NOR circuit 14a is supplied with the signal BURST and the signal CKEIN. An output terminal of the NOR circuit 14a is connected to one of input terminals of a NAND circuit 14d through a clocked inverter circuit 14b which are driven by the internal clock signals CLKIN1 and /CLKIN1 and an inverter circuit 14c.

The signal CLKIN1 is input into one of the other input terminals of the NAND circuit 14d through inverter circuits 14e and 14f. An output terminal of the NAND circuit 14d is connected to one of input terminals of a NAND circuit 14*h* constituting a flip-flop circuit 14*g*. One of input terminals of a NAND circuit 14*i* constituting the flip-flop circuit 14*g* together with the NAND circuit 14*h* is supplied with a signal CKEIN through an inverter circuit 14*j*. An output terminal of the NAND circuit 14*i* is connected to inverter circuits 14*k* and 14*l* in series, and the power-down signal /PDENTR is output from an output terminal of the inverter circuit 14*l*. The signal /PDENTR is set at a low level in the power-down mode. The burst signal BURST is output from the burst-length counter 44*d*, and set at a high level in the burst operation, and at a low level in the other time.

Figure 5:
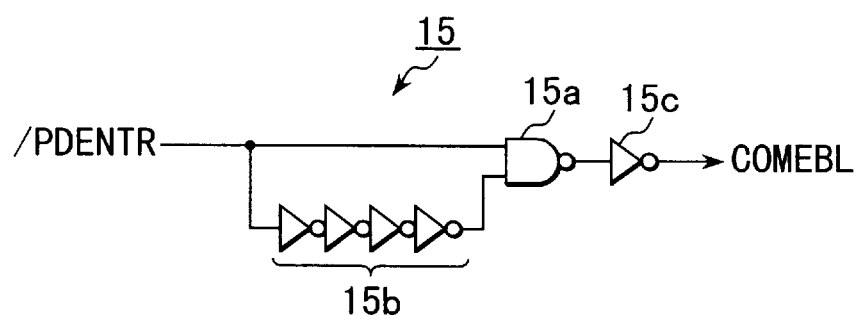
FIG. 5 is a circuit diagram showing one example of a command control circuit shown in FIG. 1.
Figure 6:
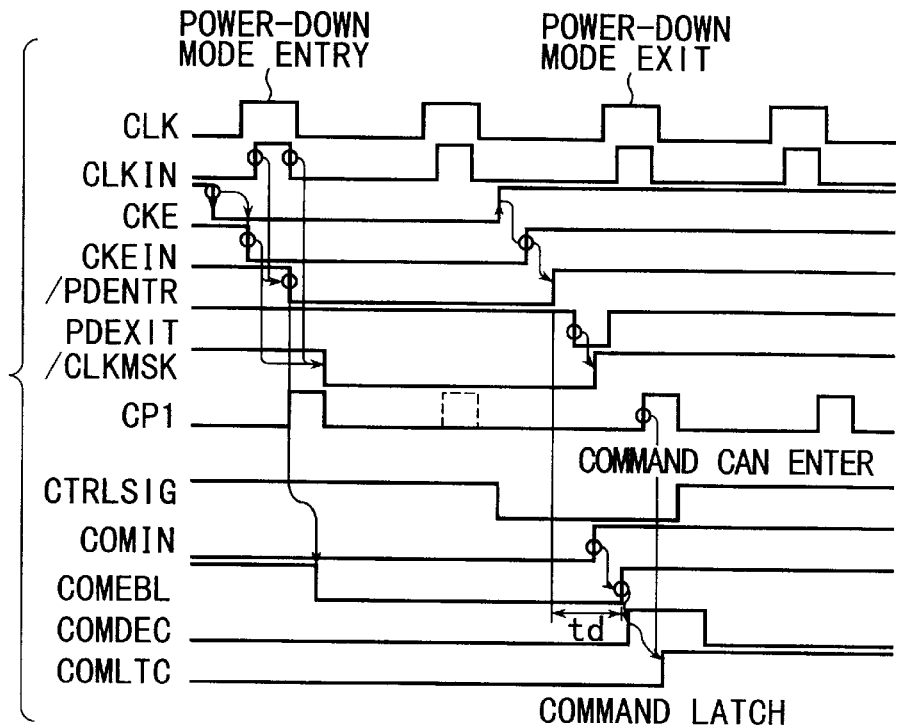
FIG. 6 is a timing chart showing the operations of the circuits shown in FIG. 1.

FIG. 5 shows the constitution of the command control circuit 15. The power-down signal /PDENTR output from the power-down control circuit 14 is supplied to one of input terminals of a NAND circuit 15*a* through a delay circuit 15*b*, and to one of the other input terminals of the NAND circuit 15*a*. The delay circuit 15*b* is constituted of four inverter circuits arranged in series, for example. An output terminal of the NAND circuit 15*a* is connected to an inverter circuit 15*c* from an output terminal of which the command enable signal COMEBL is output. The command enable signal COMEBL is a delay signal having the same phase as that of the power-down signal /PDENTR. When the clock signal CLK is set at a high level, the delay time td set for the delay circuit 15*b* is set such that a period from the time when the clock enable signal CKE is set at a high level to a time when a decode signal COMDEC is output from a command decoder 43 is longer than a period from the time when the clock enable signal CKE is set at a high level to the time when the internal clock signal CP1 is output. In other words, the delay time td is set so as to delay the output of the signal COMEBL by a period from the rising of the power-down signal /PDENTR to the output of the internal clock signal CP1, and to delay the decoded output COMDEC of the command decoder 43, as shown in FIG. 6.

The operation of the device with the above-mentioned constitution will be described next with reference to FIG. 6. At first, when the device is being set in the power-down mode, the clock enable signal CKE is set at a low level. In accordance therewith, the signal CKEIN as the output of the input buffer circuit 41*f* is also set at a low level. The power-down control circuit 14 receives the signal CKEIN in accordance with the signal CLKIN1 supplied from the input buffer circuit 11, and sets the NAND circuit 14*h* constituting the flip-flop circuit 14*g* shown in FIG. 4 at a low level. Thereby, a potential level at an output terminal of the NAND circuit 14*i* is set at a low level, and the power-down signal /PDENTR output from the inverter circuit 14*l* as an output terminal of the flip-flop circuit 14*g* is set at a low level. In this manner, when the device is being set in the power-down mode, the operations of the input buffer circuits 11 and 16 and the like are stopped, the power consumption of the device will be reduced thereby.

When the power-down signal /PDENTR is set at a low level in this manner, the command enable signal COMEBL output from the command control circuit 15 is set at a low level, thereby the operation of the command decoder 43 is stopped.

On the other hand, the clock control circuit 13 receives the signal CKEIN in response to the signal CLKIN1 through the route shown in FIG. 3 in which the clocked inverter circuit 13*a*, the inverter circuit 13*b*, and the clocked inverter circuit 13*c* are connected in series, and outputs from the inverter circuit 13*j* a mask signal /CLKMSK set at a low level. Upon receiving the mask signal /CLKMSK, the clock driving circuit 12 masks the internal clock signal CP1. Thereby, the latch circuit 20 connected to the output terminal of the command decoder 43 is made to be non-activated, and the command is inhibited from being transferred from the command decoder 43.

Next, the case where the device exits from the power-down mode will be described below. The clock enable signal CKE is set at a high level in the power-down mode, then the power-down control circuit 14 sets the power-down signal /PDENTR at a high level in non-synchronization with the clock signal. More specifically, as shown in FIG. 4, the signal CKEIN output from the input buffer circuit 41*f* is supplied to the NAND circuit 14*i* constituting the flip-flop circuit 14*g* through the inverter circuit 14*j*. Then, the output signal of the NAND circuit 14*i* is inverted to set the power-down signal /PDENTR output from the inverter circuit 14*l* at a high level.

When the power-down signal /PDENTR is set at a high level as described above, the input buffer circuits 11 and 16, and the like are activated. Simultaneously, the clock control circuit 13 sets a mask signal /CLKMSK at a high level by a signal PDEXIT generated by the delay circuit 13*f* and the NAND circuit 13*e* and a signal CKEIN upon receiving the power-down signal /PDENTR. The clock driving circuit 12 supplied with the mask signal /CLKMSK thereby releases the masking of the internal clock signal CP1.

In the mean time, when the power-down signal /PDENTR is set at a high level, the command enable signal COMEBL output from the command control circuit 15 is set at a high level. In the device of the present invention, the rising of the command enable signal COMEBL is delayed than that of the power-down signal /PDENTR by the delay circuit 15*b* shown in FIG. 5, by which the command latch error can be prevented. To be more specific about the command latch error, in the above-mentioned embodiment, the device exits from the power-down mode in response to the clock enable signal CKE in non-synchronization with the clock signal, and thus some unnecessary internal clock signal may be generated at the time when the device exist from the power-down mode, and the device may undesirably latch a command in accordance with the unnecessary internal clock signal.

Figure 7:
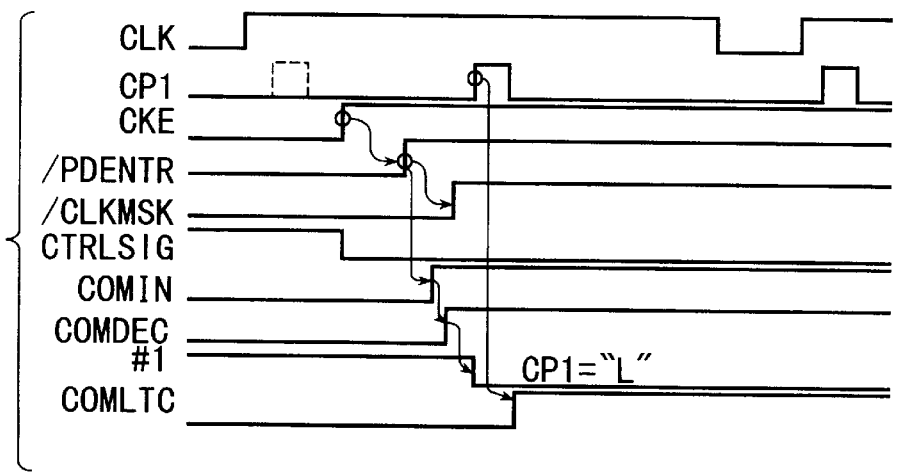
FIG. 7 is a timing chart showing the operations of the circuits shown in FIG. 1.

FIG. 7 shows the operation of the device not provided with the command control circuit 15 as described above. In this case, when the signal COMDEC output from the command decoder 43 is set at a high level in a condition where the power-down signal /PDENTR is set at a high level to set the device out of the power-down mode, the internal clock signal CP1 is set at a low level. Therefore, the clocked inverter circuit 17 is in operation, and an output signal #1 is set at a low level. When the internal clock signal CP1 is output subsequently, the clocked inverter circuit 19 outputs the signal #1 to invert it, and thus the command signal COMLTC is set at a high level. In this manner, the command latch error may occur without the command control circuit.

Figure 8:
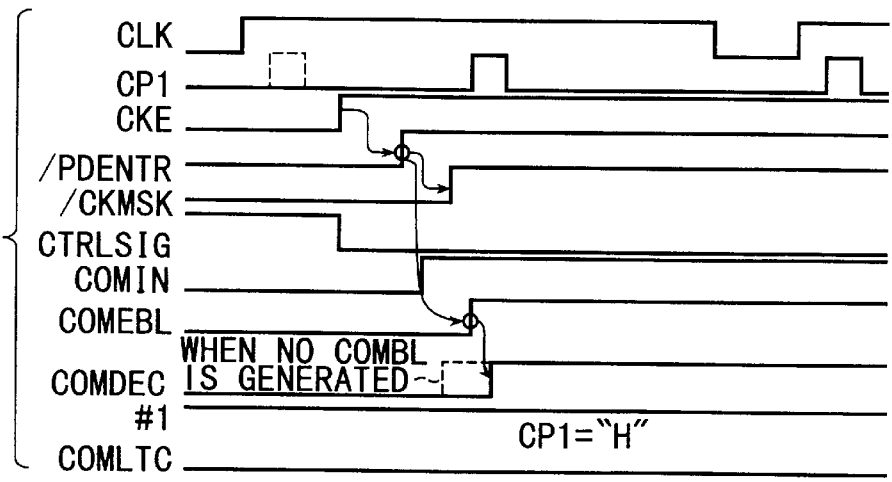
FIG. 8 is a timing chart showing the operations of the circuits shown in FIG. 1.
Figure 9:
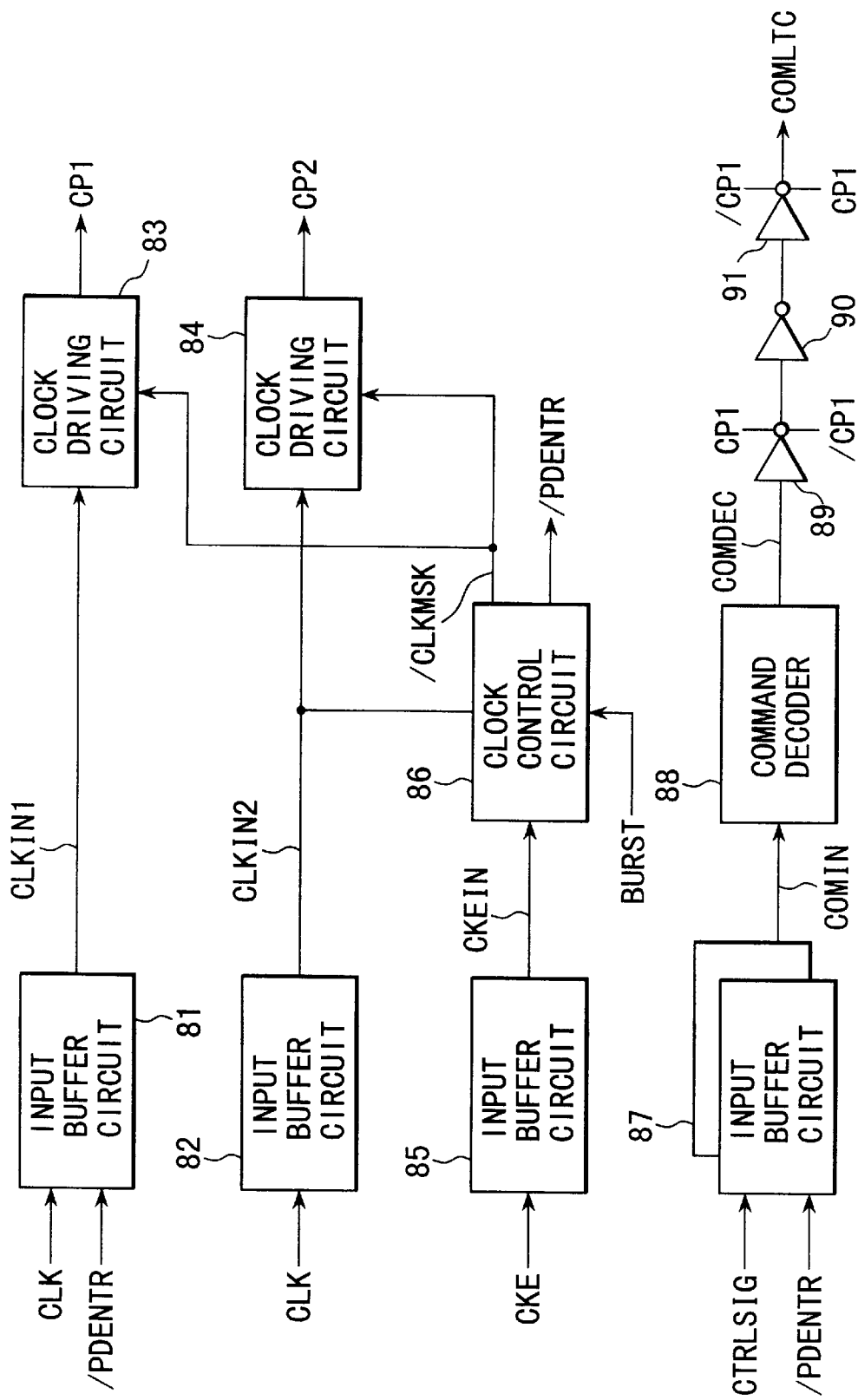
FIG. 9 is a block diagram of a circuit constitution showing the conventional power-down controlling section.

Contrarily, when the command control circuit 15 is provided to the device as shown in FIG. 8, the timing at which the signal COMDEC is output from the command decoder 43 is delayed than the timing at which the internal clock signal CP1 is generated, by the output signal COMEBL of the command control circuit 15. Accordingly, the latch circuit 20 can reliably transfer the signal COMDEC output from the command decoder 43 in response to the internal clock signal CP1.

According to the above-mentioned embodiment, when the device exits from the power-down mode, the power-down control circuit 14 sets the power-down signal /PDENTR at a high level by the clock enable signal CKE asynchronous with the clock signal. As is clear from this, the device of the present invention does not need the period of time which has been conventionally necessary for this type of device, i.e., one clock from the releasing of the power-down mode to the activation of the circuits. Accordingly, the device of the present invention reduces the period of time from the releasing of the power-down mode to the latching of the command at which the command can be transferred will be reduced, and can attain a high-speed operation.

Further, the conventional device needs to be provided with two input buffer circuits which are activated in the power-down mode and through which a through current flows. In this embodiment, it is only the input buffer circuit 41f for receiving a clock enable signal CKE that is activated in the power-down mode, and thus the power consumption of the device can be reduced.

In addition, according to the above-mentioned device, when the device exits from the power-down mode by the command control circuit 15, the timing of the decoding of the command decoder 45 is delayed than the rising of the internal clock signal. Therefore, any error command latching will be reliably prevented.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a power-down control circuit for generating first and second power-down signals in accordance with first and second logic levels of a clock enable signal, the power-down control circuit generating the first power-down signal for setting the device in a power-down mode in accordance with the first logic level of the clock enable signal which allows a clock signal to input into the device, and generating the second power-down signal for releasing the power-down mode in accordance with the second logic level of the clock enable signal;
   a clock controlling section connected to the power-down control circuit, the clock controlling section making an internal clock signal non-activate in accordance with the first power-down signal output from the power-down control circuit, and activating the internal clock signal in accordance with the second power-down signal;
   a decoder for decoding a plurality of input signal supplied to the decoder; and
   a latch circuit connected to the decoder, the latch circuit latching an output signal of the decoder in accordance with the internal clock signal activated by the clock controlling section.

2. A device according to claim 1, further comprising:
   a delay circuit arranged between the power-down control circuit and the decoder, the delay circuit delaying a timing at which the decoder decodes the input signal till the clock controlling section activates the internal clock signal in accordance with the second power-down signal output from the power-down control circuit.

3. A device according to claim 1, the clock controlling section comprising:

a clock control circuit connected to the power-down control circuit, the clock control circuit generating a mask signal for masking the internal clock signal in accordance with the first power-down signal output from the power-down control circuit, and generating a mask releasing signal for releasing the masking in accordance with the second power-down signal;

an input buffer circuit made to be non-activated in accordance with the first power-down signal output from the power-down control circuit upon receiving an externally supplied clock signal; and a clock driving circuit connected to an output terminal of the input buffer circuit, the clock driving circuit making the internal clock signal non-activate in accordance with the mask signal supplied from the clock control circuit, and activating the internal clock signal in accordance with the mask releasing signal.

4. A device according to claim 3, further comprising an input buffer circuit connected to the power-down control circuit and the clock control circuit, the input buffer circuit supplying the clock enable signal to the power-down control circuit and the clock control circuit upon receiving the clock enable signal asynchronous with the clock signal.

5. A semiconductor memory device comprising:
   a first input buffer circuit supplied with a clock enable signal asynchronous with a clock signal;
   a power-down control circuit connected to the first input buffer circuit, the power-down control circuit generating a first power-down signal for setting the device in a power-down mode in accordance with a first logic level of the clock enable signal supplied from the first input buffer circuit, and generating a second power-down signal for releasing the power-down mode in accordance with a second logic level of the clock enable signal;
   a clock control circuit connected to the power-down control circuit, the clock control circuit generating a mask signal for masking the internal clock signal in accordance with the first power-down signal output from the power-down control circuit, and generating a mask releasing signal for releasing the masking in accordance with the second power-down signal;
   a second input buffer circuit connected to the power-down control circuit and supplied with the clock signal, the second buffer circuit made to be non-activated in accordance with the first power-down signal output from the power-down control circuit;
   a clock driving circuit connected to an output terminal of the second input buffer circuit, the clock driving circuit making the internal clock signal non-activate in accordance with the mask signal supplied from the clock control circuit, and activating the internal clock signal in accordance with the mask releasing signal;
   a decoder for decoding a plurality of input signal supplied to the decoder;
   a delay circuit arranged between the power-down control circuit and the decoder, the delay circuit delaying a timing at which the decoder decodes the input signal till the clock driving circuit activates the internal clock signal in accordance with the second power-down signal output from the power-down control circuit; and
   a latch circuit connected to the decoder, the latch circuit latching an output signal of the decoder in accordance with the internal clock signal activated by the clock driving circuit.

6. A synchronous DRAM comprising:

a first input buffer circuit supplied with a clock signal;

a clock driving circuit for generating an internal clock signal in accordance with the clock signal supplied from the first input buffer circuit;

a memory block having a plurality of banks;

a command decoder for decoding an input signal to output a decode signal;

a control signal generating circuit for generating a control signal for controlling the memory block in accordance with the decode signal supplied from the command decoder, upon receiving an internal clock signal supplied from the clock driving circuit; and a power-down controlling section for setting the DRAM in a power-down mode in accordance with a first logic level of a clock enable signal and for releasing the power-down mode in accordance with a second logic level of the clock enable signal, the power-down controlling section delays the decode signal output from the command decoder till the clock driving circuit outputs an internal clock signal in releasing the power-down mode.

7. A device according to claim 6, the power-down controlling section comprising:

a second input buffer circuit supplied with a clock enable signal asynchronous with a clock signal;

a power-down control circuit connected to the second input buffer circuit, the power-down control circuit generating a first power-down signal for setting the DRAM in a power-down mode in accordance with a first logic level of the clock enable signal supplied from the second input buffer circuit, and generating a second power-down signal for releasing the power-down mode in accordance with a second logic level of the clock enable signal;

a clock control circuit connected at an input terminal to the power-down control circuit, and connected at an output terminal to the clock driving circuit, the clock control circuit generating a mask signal for masking the internal clock signal in accordance with the first power-down signal output from the power-down control circuit, and generating a mask releasing signal for releasing the masking in accordance with the second power-down signal; and a delay circuit arranged between the power-down control circuit and the decoder, the delay circuit delaying a timing at which the decoder decodes the input signal till the clock driving circuit activates the internal clock signal in accordance with the second power-down signal output from the power-down control circuit.

8. A device according to claim 7, wherein the first input buffer circuit is connected to the power-down control circuit, and is made to be non-activated in accordance with the first power-down signal output from the power-down control circuit.

9. A device according to claim 7, wherein the decoder is connected to a latch circuit for latching the decode signal output from the decoder, in accordance with the internal clock signal activated by the clock driving circuit.

* * * * *